(12) United States Patent
Chen et al.

(10) Patent No.: US 7,808,419 B2
(45) Date of Patent: Oct. 5, 2010

(54) DIGITIZER WITH VARIABLE SAMPLING CLOCK AND METHOD USING THE SAME

(75) Inventors: Yi-Fu Chen, Taipei (TW); Ming-Luen Liou, Taipei County (TW); Cheng-I Wei, Hsinchu (TW); Chun Hua Ho, Taipei (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 12/255,960

(22) Filed: Oct. 22, 2008

(65) Prior Publication Data

US 2010/0097261 A1    Apr. 22, 2010

(51) Int. Cl.
*H03M 1/50* (2006.01)
(52) U.S. Cl. ............... 341/166; 375/316; 375/365; 455/3.02; 455/191.1
(58) Field of Classification Search ............ 341/166; 348/731, 725; 375/316, 365; 455/3.02, 191.1
See application file for complete search history.

(56) References Cited

U.S. PATENT DOCUMENTS

| | | | | |
|---|---|---|---|---|
| 5,953,636 | A * | 9/1999 | Keate et al. | 455/3.02 |
| 6,259,314 | B1 * | 7/2001 | Liu et al. | 329/304 |
| 6,847,694 | B1 * | 1/2005 | Chevrette et al. | 375/365 |
| 7,403,756 | B1 * | 7/2008 | Jiacinto et al. | 455/191.1 |
| 2002/0008787 | A1 * | 1/2002 | Kurihara | 348/731 |
| 2006/0001779 | A1 * | 1/2006 | Favrat et al. | 348/725 |
| 2007/0291876 | A1 * | 12/2007 | Shridhar et al. | 375/316 |

* cited by examiner

*Primary Examiner*—Jean B Jeanglaude
(74) *Attorney, Agent, or Firm*—Thomas, Kayden, Horstemeyer & Risley (57) ABSTRACT

A digitizer includes an analog to digital converter (ADC), a sampling frequency generator, and a controller. The ADC samples an IF signal to generate a digital signal. The sampling frequency generator is connected to the ADC and provides a sampling clock of variable frequency to the ADC. The controller is connected to the sampling frequency generator and determines frequency of the sampling clock.

12 Claims, 10 Drawing Sheets

DIGITIZER WITH VARIABLE SAMPLING CLOCK AND METHOD USING THE SAME

BACKGROUND OF THE INVENTION

1. Field of the Invention

The invention relates to a digitizer and, in particular, to a digitizer with a variable sampling clock and communication system comprising the same.

2. Description of the Related Art

Figure 1:
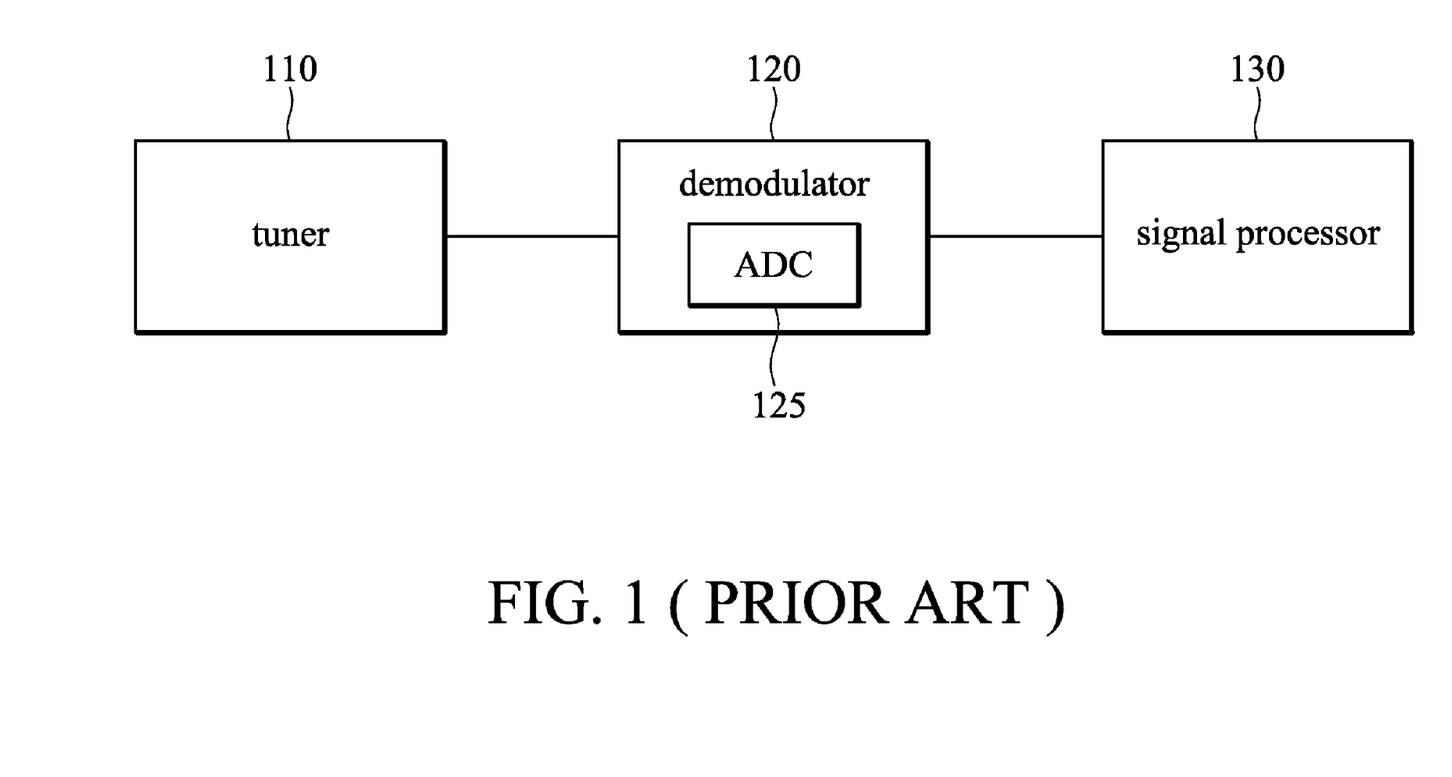
FIG. 1 is a schematic diagram of a conventional digital TV receiver.

FIG. 1 is a schematic diagram of a conventional digital TV receiver. The digital receiver 100 comprises a tuner 110, a demodulator 120, and a signal processor 130. The demodulator 120 comprises an analog to digital converter (ADC) 125. The tuner 110 receives a radio frequency (RF) signal and downconverts the same to an intermediate frequency (IF) signal. The ADC 125 in the demodulator 120 samples the IF signal and generates a digital signal. The digital signal is further demodulated in the demodulator 120 and then transmitted to the signal processor 130 for subsequent signal processing.

Figure 2:
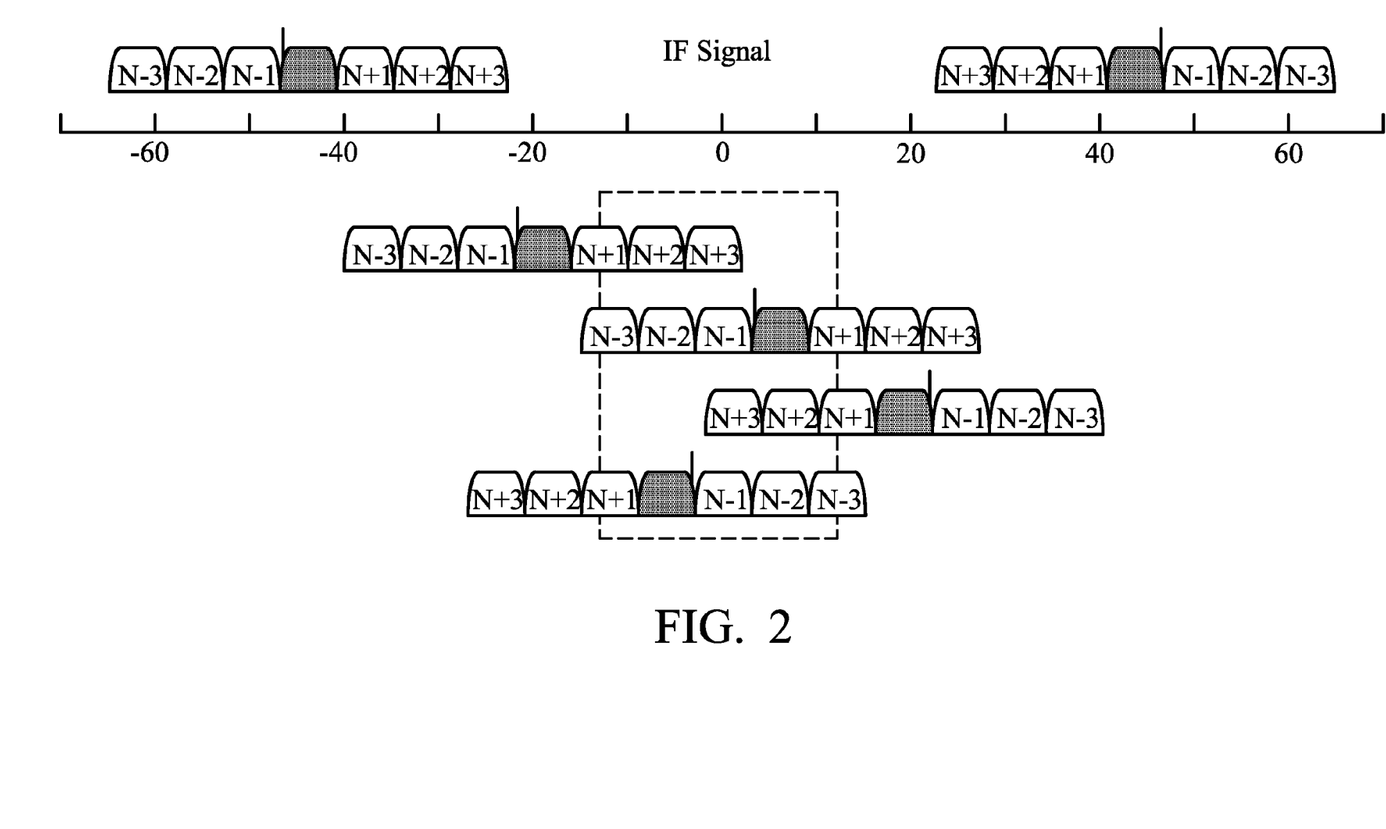
FIG. 2 is a schematic diagram of frequency distribution of channels before and after sampling of the ADC 125 in FIG. 1.

FIG. 2 is a schematic diagram of frequency distribution of channels before and after sampling of the ADC 125 in FIG. 1. The schematics above the frequency axis illustrate frequency distribution of channels in the IF signal before sampling of the ADC 125 and below the frequency axis illustrate frequency distribution of channels after sampling of the ADC 125. Shadow regions show location of desired (in-channel) signals of a channel N. Locations of unwanted adjacent channels are indicated by N+1, N+2, ... and N−1, N−2, .... As an example, to comply with television standard of USA, the desired channel N in the IF signal typically centers at 44 MHz with a bandwidth of 6 MHz. According to the Nyquist criterion, the IF signal can be digitally sampled without alias effect only if the sampling frequency is larger than the Nyquist frequency, namely, twice its highest frequency component, or for this situation, larger than 94 MHz. It is, however, impractical to sample the IF signal at a frequency larger than the Nyquist frequency. Known practices call for sampling frequencies smaller than the Nyquist frequency. This sampling introduces alias effect, which results in overlapping unwanted signals into the desired signal spectrum after subsampling. The alias effect results in poor receiving condition because the overlapping unwanted signals interfere with and deteriorate the desired signal. As an example, after 25 MHz sampling of the ADC 125, various channels are folded into a sampling window ranging from −12.5 MHz to +12.5 MHz. As shown in FIG. 2, adjacent channels N+2 and N−2 have the same frequency as the desired channel N after sampling. If power of adjacent channels N+2 and N−2 is high, the desired channel N is affected thereby and the demodulator 120 may not work properly.

BRIEF SUMMARY OF THE INVENTION

An embodiment of a digitizer comprises an analog to digital converter (ADC), a sampling frequency generator, and a controller. The ADC samples an IF signal to generate a digital signal. The sampling frequency generator is coupled to the ADC and provides a sampling clock of variable frequency to the ADC. The controller is coupled to the sampling frequency generator and determines frequency of the sampling clock.

An embodiment of a communication system comprises a tuner, an analog to digital converter (ADC), a sampling frequency generator, and a controller. The tuner generates an intermediate frequency (IF) signal. The ADC samples the IF signal to generate a digital signal. The sampling frequency generator is coupled to the ADC and provides a sampling clock of variable frequency to the ADC. The controller is coupled to the sampling frequency generator and determines frequency of the sampling clock.

An embodiment of a method of receiving a radio frequency (RF) signal comprises performing channel scan to check power and carrier frequency offset of each channel, tuning frequency of a local oscillator (LO) in a tuner to minimize intermediate frequency (IF) carrier offset, and checking power level of adjacent channel interference (ACI) and determining a sampling rate of an analog to digital converter (ADC) accordingly.

An embodiment of a method of receiving a radio frequency (RF) signal comprises checking power level of adjacent channel interference (ACI) and determining a sampling rate of an analog to digital converter (ADC) accordingly, and changing the sampling rate of the ADC and performing channel reacquisition.

The invention provides a digitizer with a variable sampling clock and a communication system and a method using the same. The sampling clock can be adjusted such that strong adjacent channel interference (ACI) is prevented from aliasing into desired (in-channel) signal. Furthermore, the sampling clock can be adjusted such that dynamic range utilization is improved and power consumption is reduced if no ACI is introduced.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 3:
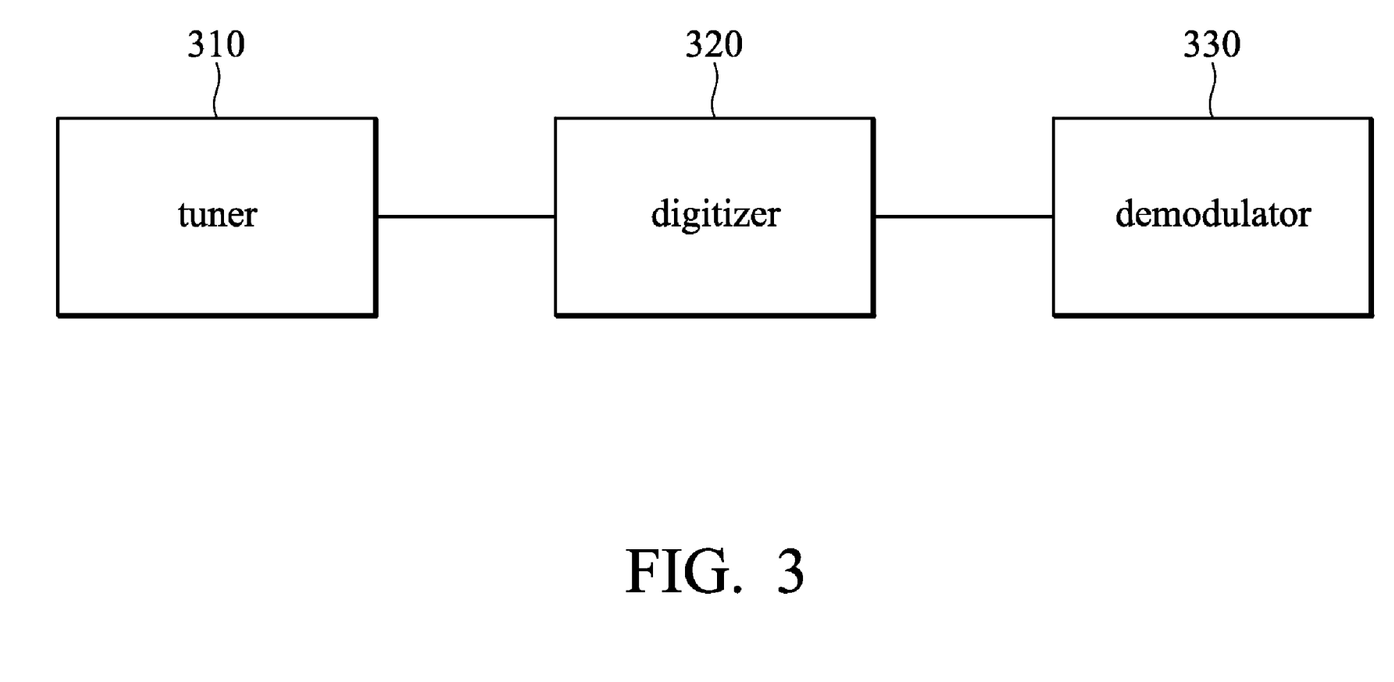
FIG. 3 is a block diagram of a communication system according to an embodiment of the invention.

FIG. 3 is a block diagram of a communication system according to an embodiment of the invention. The communication system 300 comprises a tuner 310, a digitizer 320, and a demodulator 330. The tuner 310 receives a radio frequency (RF) signal and downconverts the same to an intermediate frequency (IF) signal. The digitizer 320 samples the IF signal and generates a digital signal. The digital signal is transmitted to the demodulator 330 and demodulated thereby. Frequency of a sampling clock of the digitizer 320 is dynamically adjusted such that performance of the communication system 300 is optimized.

Figure 4A:
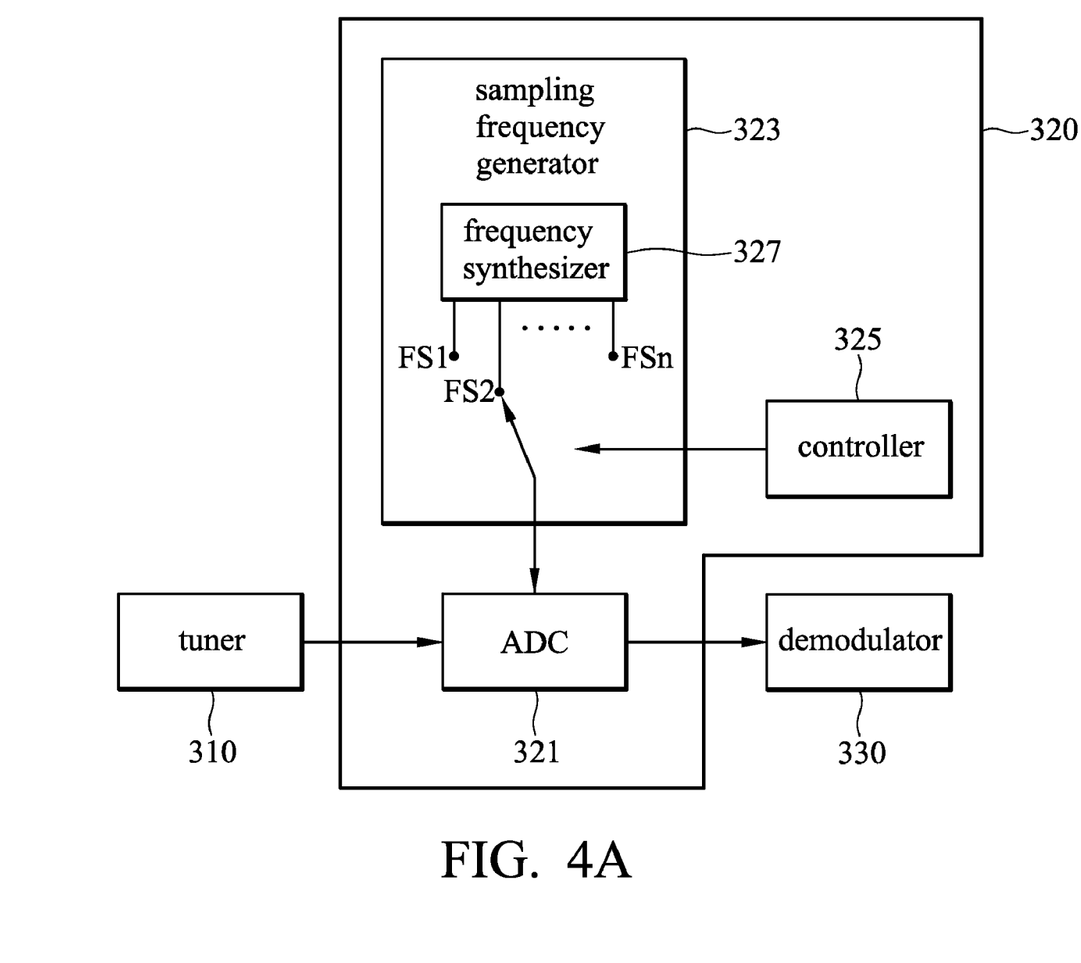
FIG. 4A is a detailed block diagram of the communication system in FIG. 3.

FIG. 4A is a detailed block diagram of the communication system in FIG. 3 according to an embodiment of the invention. In FIG. 4A, the digitizer 320 comprises an analog to digital converter (ADC) 321, a sampling frequency generator 323, and a controller 325. The ADC 321 samples the IF signal from the tuner 310 to generate a digital signal. The sampling frequency generator 323 is coupled to the ADC 321 and comprises a frequency synthesizer 327. The frequency synthesizer 327 generates a plurality of sampling frequencies FS1, FS2, . . . , FSn. The controller 325 is coupled to the sampling frequency generator 323 and selects one of the sampling frequencies as the sampling clock. More specifically, the sampling clock is selected according to channel scan results, trial and error or combinations thereof.

Figure 4B:
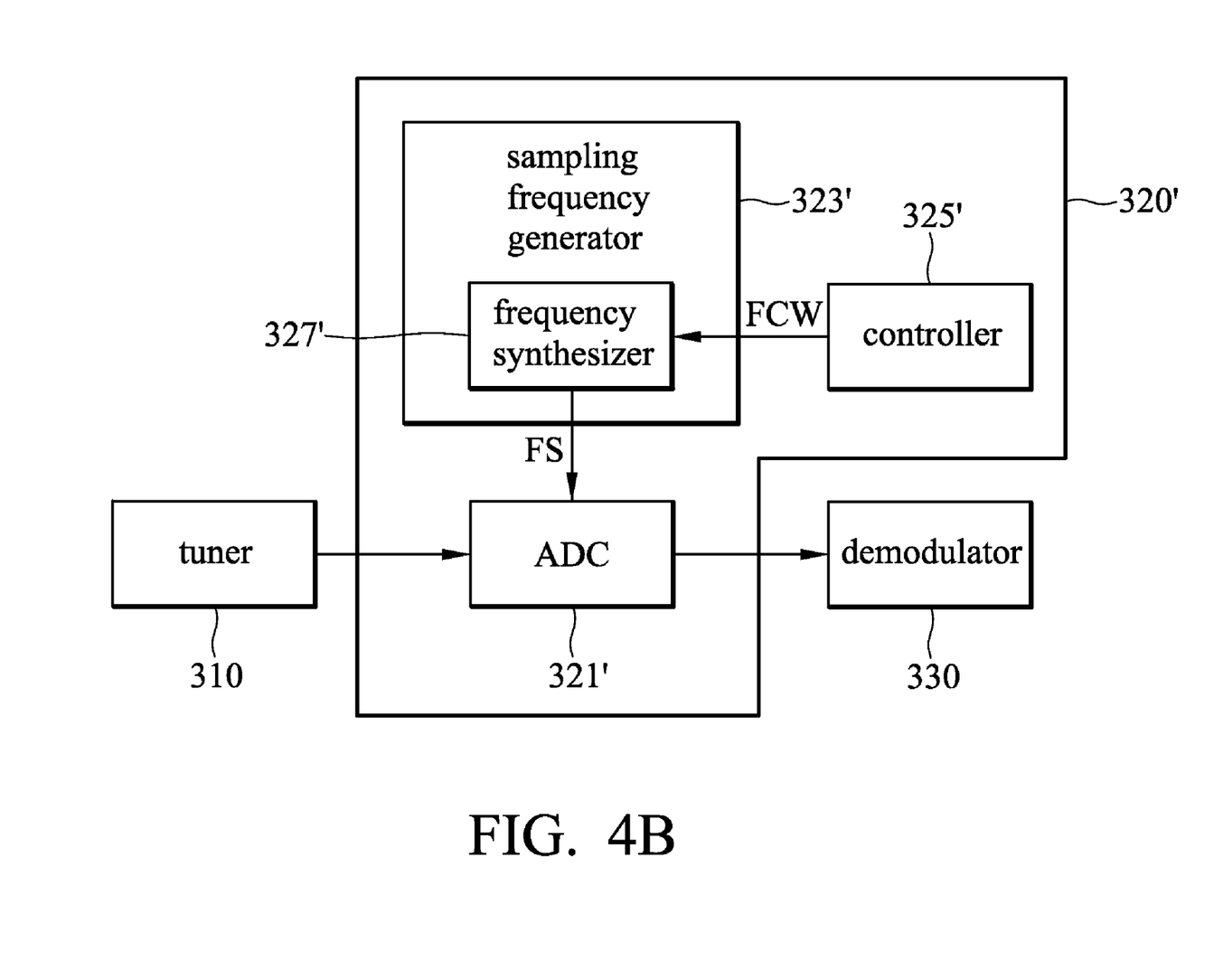
FIG. 4B is a detailed block diagram of the communication system in FIG. 3.

FIG. 4B is a detailed block diagram of the communication system in FIG. 3 according to another embodiment of the invention. In FIG. 4A, the digitizer 320', which is another example for implementing the digitizer 320 in FIG. 3, comprises an analog to digital converter (ADC) 321', a sampling frequency generator 323', and a controller 325'. The ADC 321' samples the IF signal from the tuner 310 to generate a digital signal. The sampling frequency generator 323' is coupled to the ADC 321 and comprises a frequency synthesizer 327'. The controller 325' is coupled to the sampling frequency generator 323' and provides a frequency control word FCW to the frequency synthesizer 327' therein. The frequency synthesizer 327' generates the sampling clock FS according to the frequency control word FCW from the controller 325'. More specifically, the sampling clock is selected according to channel scan results, trial and error or combinations thereof.

FIGS. 5A~5D are respectively schematic diagrams of frequency distribution of channels before and after exemplary 50 MHz, 53 MHz, 56 MHz, and 60 MHz sampling of the ADC in FIGS. 4A and 4B. The schematics above the frequency axis show frequency distribution of channels in the IF signal before sampling of the ADC and those below the frequency axis show frequency distribution of channels after sampling of the ADC. Shadow regions show location of desired (in-channel) signals of a channel N. Locations of unwanted adjacent channels are indicated by N+1, N+2, . . . and N−1, N−2, . . . . To comply with television standard of USA, the desired channel N in the IF signal typically centers at 44 MHz. As shown in FIGS. 5A~5D, various channels are folded into a sampling window ranging from −25 MHz to +25 MHz, from −26.5 MHz to +26.5 MHz, from −28 MHz to +28 MHz, and −30 MHz to +30 MHz after sampling of the ADC.

Figure 5A:
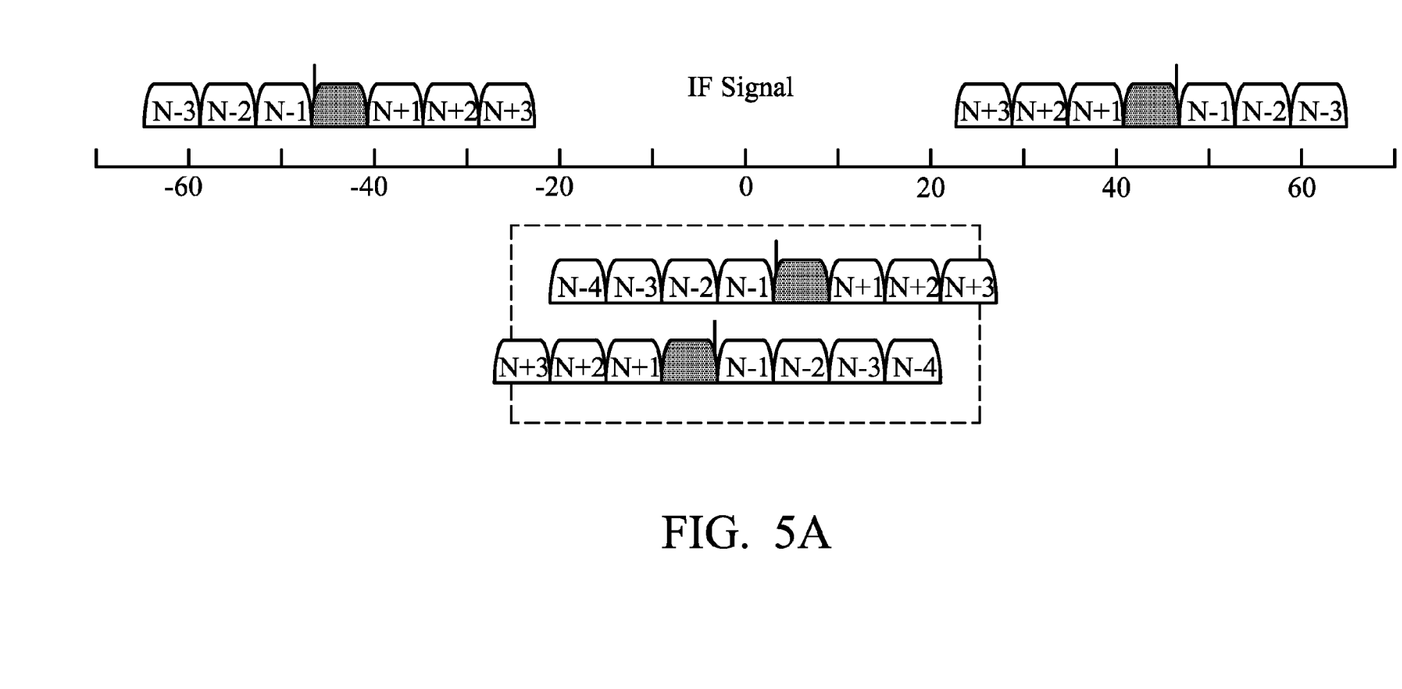
FIGS. 5A–5D are schematic diagrams of frequency distribution of channels before and after sampling of the ADC in FIGS. 4A and 4B.
Figure 5B:
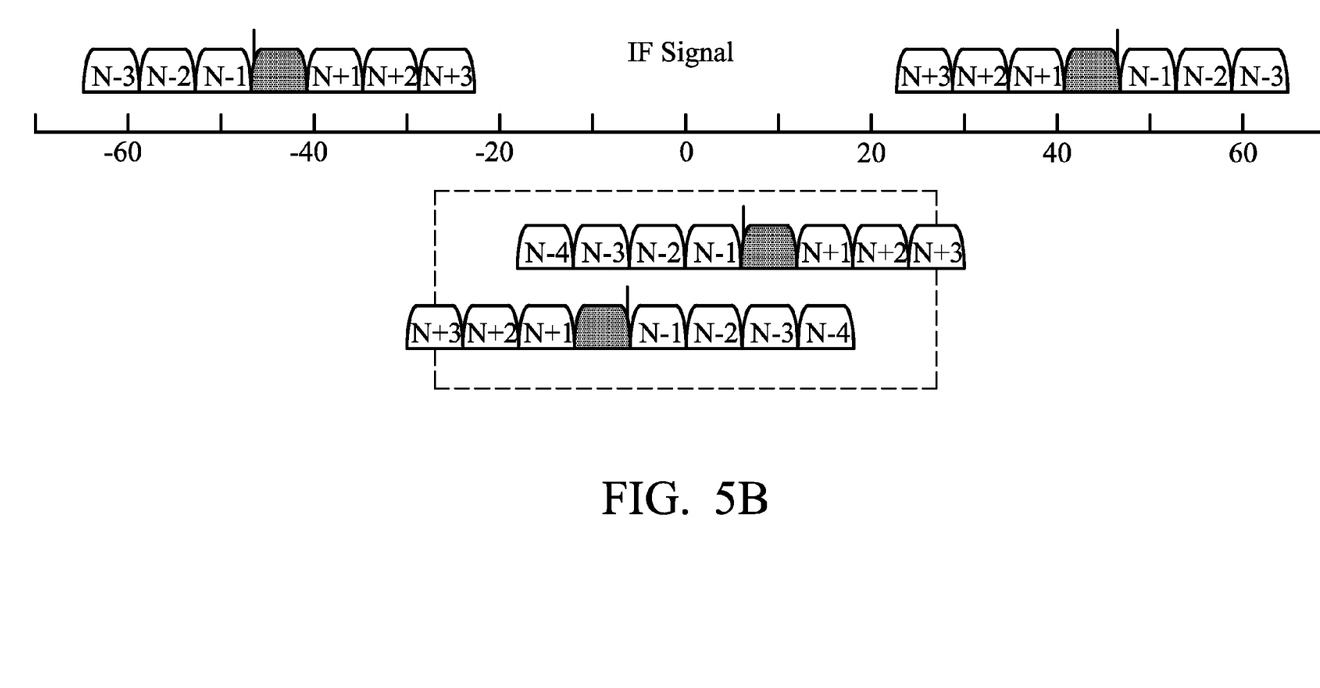
Figure 5C:
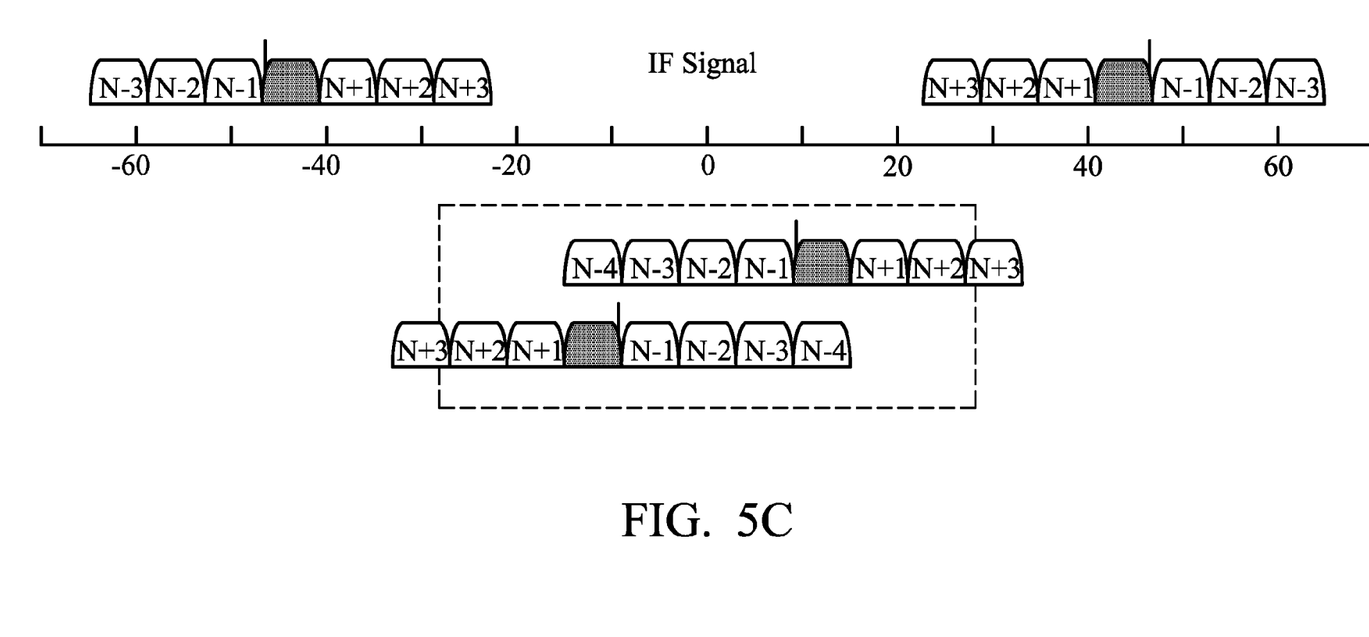
Figure 5D:
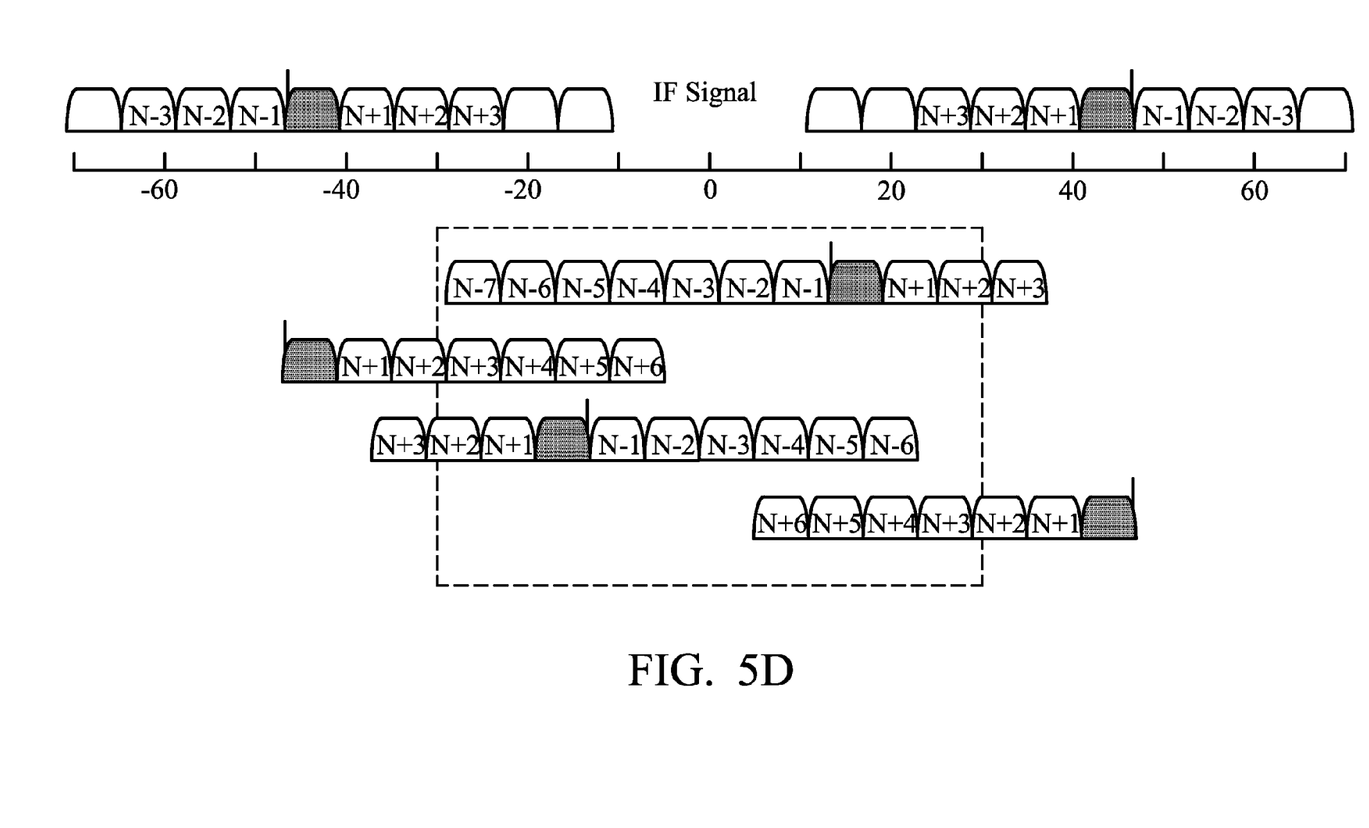

As shown in FIGS. 5A~5C, adjacent channels N−2, N−3, N−4 respectively have the same frequency as the desired channel N after sampling. In FIG. 5D, portions of adjacent channels N−4 with N−5 and N+4 with N+5 have the same frequency as the desired channel N after sampling. Typically, adjacent channels farther from the desired channel N have weaker signal power and have less interference with the desired channel N. As a result, a higher sampling frequency of the exemplary frequencies leads to frequency overlap between adjacent channels farther from the desired channel N and the same and strong adjacent channel interferences (ACI) are prevented from aliasing into the desired channel N. In general, FIGS. 5A~5D demonstrate that changing sampling frequency will result in various spectral alias situations, under which different unwanted adjacent channels overlap with the desired channel. A sampling frequency can be selected and used such that small or nonexistent ACI are overlapping with the desired channel. Since the controller in the digitizer of the disclosed communication system dynamically adjusts frequency of the sampling clock, the undesirable effect of ACI is significantly neutralized. In addition, additional components, such as SAW (surface acoustic wave) filter and so on, are incorporated in a conventional receiver of the communication system to suppress strong ACI before ACI can overlap with the desired channel during sampling, and are not required in the communication system according to an embodiment of the invention, as the strong ACI are not overlapping with the desired channel, therefore resulting in lower bill of material (BOM) cost. Furthermore, if there is no ACI, the controller in the digitizer of the disclosed communication system chooses a sampling clock with lower frequency and power consumption of the digitizer is thus reduced.

Figure 6:
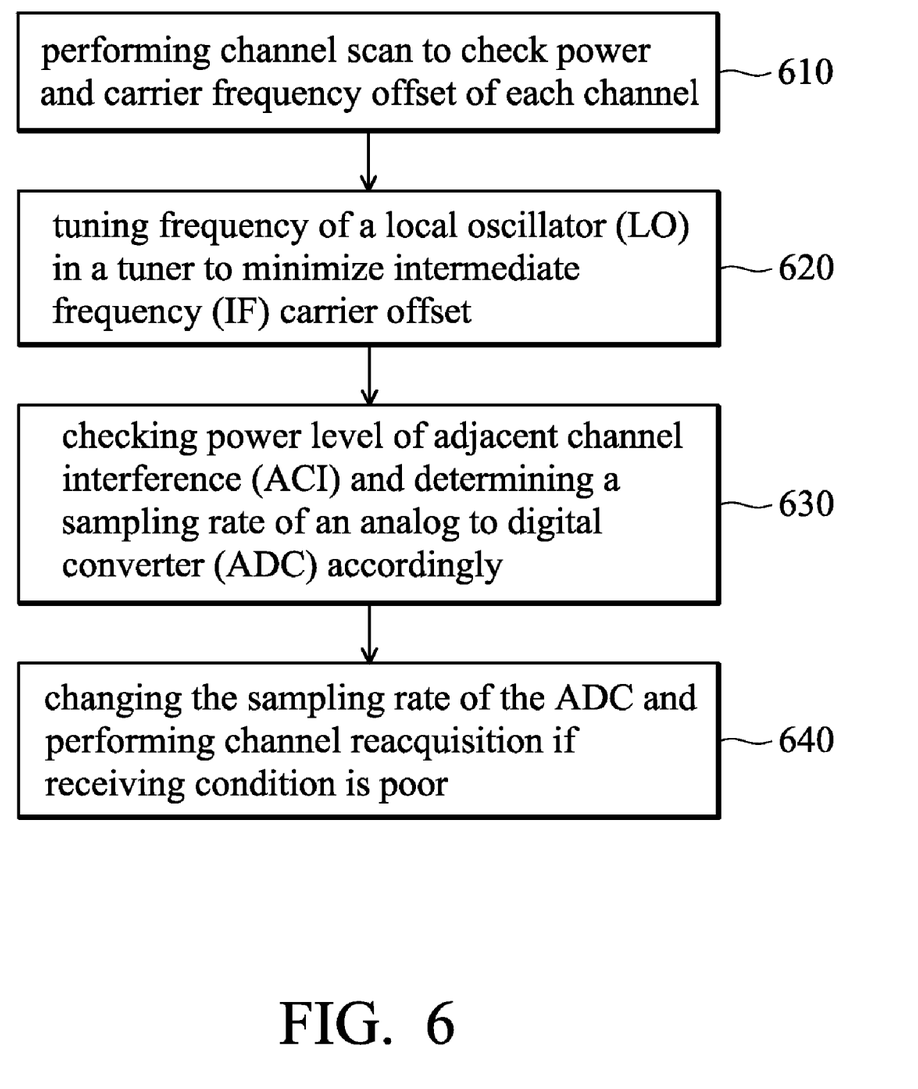
FIG. 6 is a flowchart of a method of receiving a radio frequency (RF) signal according to an embodiment of the invention.

FIG. 6 is a flowchart of a method of receiving a radio frequency (RF) signal according to an embodiment of the invention. The method comprises performing channel scan to check power and carrier frequency offset of each channel (step 610), tuning frequency of a local oscillator (LO) in a tuner to minimize intermediate frequency (IF) carrier offset (step 620), checking power level of adjacent channel interference (ACI) and determining a sampling rate of an analog to digital converter (ADC) accordingly (step 630), changing the sampling rate of the ADC and performing channel reacquisition if receiving condition is poor (step 640). Selection of sampling rate of the ADC is determined according to channel scan results of step 610 and/or results of trial and error of step 640. After channel scan (step 610), the signal power and exact frequency location plus possible offset of the each RF channel are known. The frequency locations of the desired channel N and, therefore, of the unwanted adjacent channels are identified after step 620. Combining the results of steps 610 and 620, the power level and exact spectral location of each adjacent channel is known. For step 630, the sampling frequency of the ADC is determined such that the weakest among the adjacent channels is overlapping with the desired channel after sampling. Following the example given in FIGS. 5A~5D, which illustrate the spectral overlapping after sampling using 50 MHz, 53 MHz, 56 MHz, and 60 MHz, if the adjacent channel N−3 is known to have the least power among all adjacent channels of a desired channel N, the 53 MHz sampling frequency can be used instead of other sampling frequencies to minimize the interference. When the LO frequency is tuned to another RF channel in step 620, the power level of adjacent channels may change, and the ADC sampling frequency is re-selected so that interference is minimized and receiving condition is best. Practically the channel scan results of step 610 may be inaccurate or obsolete. As a result, the sampling frequency determined in step 630 elaborated above may still lead to poor receiving condition, which triggers step 640. A second sampling frequency is selected to sample the IF signal. The receiving condition is checked for the second sampling frequency. Poor receiving condition triggers on-going sampling frequency re-selection. The trial-and-error process in step 640 continues until a suitable sampling frequency is determined.

The invention provides a digitizer with a variable sampling clock and a communication system and a method using the same. The sampling clock can be adjusted such that strong adjacent channel interference (ACI) is prevented from aliasing into wanted (in-channel) signal. Furthermore, the sampling clock can be adjusted such that power consumption is reduced if no ACI is introduced. Such mechanism of dynamic selection of sampling frequency may be implemented into the controller 325 and 325' in the embodiments of FIG. 4A and FIG. 4B.

While the invention has been described by way of example and in terms of preferred embodiment, it is to be understood that the invention is not limited thereto. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A communication system, comprising:
    a tuner generating an intermediate-frequency (IF) signal;
    an analog to digital converter (ADC) coupled to the tuner and sampling the IF signal to generate a digital signal;
    a sampling frequency generator coupled to the ADC and providing a sampling clock of variable frequency to the ADC; and
    a controller coupled to the sampling frequency generator and determining frequency of the sampling clock, wherein the sampling clock is selected according to channel scan results.

2. The communication system as claimed in claim 1, wherein the sampling frequency generator comprises a frequency synthesizer generating a plurality of sampling frequencies and the controller selects one of the sampling frequencies as the sampling clock.

3. The communication system as claimed in claim 1, wherein the sampling clock is selected by checking subsequent trial and error.

4. The communication system as claimed in claim 1, wherein the sampling frequency generator comprises a frequency synthesizer generating the sampling clock according to a frequency control word from the controller.

5. A method of receiving a radio frequency (RF) signal, comprising:
    performing channel scan to check power and carrier frequency offset of each channel;
    tuning frequency of a local oscillator (LO) in a tuner to minimize intermediate frequency (IF) carrier offset; and
    checking power level of adjacent channel interference (ACI) and determining a sampling rate of an analog to digital converter (ADC) accordingly.

6. The method as claimed in claim 5, further comprising changing the sampling rate of the ADC and performing channel reacquisition.

7. A method of receiving a radio frequency (RF) signal, comprising:
    checking power level of adjacent channel interference (ACI) and determining a sampling rate of an analog to digital converter (ADC) accordingly; and
    changing the sampling rate of the ADC and performing channel reacquisition.

8. A digitizer, comprising:
    an analog to digital converter (ADC) sampling an intermediate frequency (IF) signal to generate a digital signal;
    a sampling frequency generator coupled to the ADC and providing a sampling clock of variable frequency to the ADC; and
    a controller coupled to the sampling frequency generator and determining frequency of the sampling clock, wherein the sampling clock is selected according to channel scan results.

9. The digitizer as claimed in claim 8, wherein the sampling frequency generator comprises a frequency synthesizer generating the sampling clock according to a frequency control word from the controller.

10. The digitizer as claimed in claim 9, wherein the sampling clock is selected by checking subsequent trial and error.

11. The digitizer as claimed in claim 8, wherein the sampling frequency generator comprises a frequency synthesizer generating a plurality of sampling frequencies and the controller selects one of the sampling frequencies as the sampling clock.

12. The digitizer as claimed in claim 8, wherein the sampling clock is selected by checking subsequent trial and error.

* * * * *